(12) United States Patent
Mainguet et al.

(10) Patent No.: US 10,991,751 B2
(45) Date of Patent: Apr. 27, 2021

(54) PRINT SENSOR WITH GALLIUM NITRIDE LED

(71) Applicant: COMMISSARIAT A L'ENERGIE ATOMIQUE ET AUX ENERGIES ALTERNATIVES, Paris (FR)

(72) Inventors: Jean-Francois Mainguet, Grenoble (FR); Francois Templier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 154 days.

(21) Appl. No.: 15/900,505

(22) Filed: Feb. 20, 2018

(65) Prior Publication Data

US 2018/0240843 A1 Aug. 23, 2018

(30) Foreign Application Priority Data

Feb. 21, 2017 (FR) ...................................... 17 51359

(51) Int. Cl.
*G06K 9/00* (2006.01)
*H01L 27/146* (2006.01)
(Continued)

(52) U.S. Cl.
CPC ...... *H01L 27/14678* (2013.01); *G06K 9/0004* (2013.01); *H01L 27/14694* (2013.01);
(Continued)

(58) Field of Classification Search
CPC ............. H01L 27/14678; H01L 31/024; H01L 27/14694; H01L 27/16; H01L 31/173;
(Continued)

(56) References Cited

U.S. PATENT DOCUMENTS 6,061,464 A * 5/2000 Leger ................... G06K 9/0002
382/124
7,994,524 B1 * 8/2011 Chung .................. H01L 27/156
257/90
(Continued)

FOREIGN PATENT DOCUMENTS

FR 3 046 275 A1 6/2017
FR 3 046 277 A1 6/2017
(Continued)

OTHER PUBLICATIONS

French Preliminary Search Report dated Sep. 27, 2017 in French Application 17 51359, filed Feb. 21, 2017 (with English Translation of Categories of cited documents).
(Continued)

*Primary Examiner* — Solomon G Bezuayehu
(74) *Attorney, Agent, or Firm* — Oblon, McClelland, Maier & Neustadt, L.L.P.

(57) ABSTRACT

A papillary print sensor is provided, including a light emitting device configured to emit light radiation towards the sensor; and a matrix photodetector configured to be sensitive to at least part of an emission spectrum of the light emitting device, the light emitting device and the matrix photodetector being distributed together in and/or above a same semiconducting substrate, the light emitting device being composed of at least one gallium nitride light emitting diode (LED) with a series of through openings.

24 Claims, 4 Drawing Sheets

(51) Int. Cl.
  *H01L 31/173* (2006.01)
  *H01L 27/16* (2006.01)
  *H01L 31/024* (2014.01)
  *H01L 37/02* (2006.01)
  *H01L 33/32* (2010.01)

(52) U.S. Cl.
  CPC ............ *H01L 27/16* (2013.01); *H01L 31/024* (2013.01); *H01L 31/173* (2013.01); *H01L 33/32* (2013.01); *H01L 37/02* (2013.01)

(58) Field of Classification Search
  CPC ....... H01L 33/32; H01L 37/02; G06K 9/0004; G06K 9/00053
  See application file for complete search history.

(56) References Cited

U.S. PATENT DOCUMENTS

| | | | |
|---|---|---|---|
| 10,043,087 B2 * | 8/2018 | Zhu | .................... G06K 9/00906 |
| 2012/0256089 A1 | 10/2012 | Kanda et al. | |
| 2013/0127790 A1 * | 5/2013 | Wassvik | .................. G06F 3/042 |
| | | | 345/175 |
| 2015/0382426 A1 * | 12/2015 | Odnoblyudov | ........ H05B 45/37 |
| | | | 315/151 |
| 2017/0032169 A1 * | 2/2017 | Pi | ....................... G06K 9/00906 |

FOREIGN PATENT DOCUMENTS

| | | |
|---|---|---|
| JP | 2003-37708 | 2/2003 |
| WO | WO 2017/194845 A1 | 11/2017 |

OTHER PUBLICATIONS

European Search Report dated Feb. 28, 2018 in European Patent Application No. 18157452 (with English translation of Category of Cited Documents), 2 pages.
U.S. Appl. No. 14/583,967, filed Dec. 29, 2014, 2015/0191309 A1, Jean-Francois Mainguet, et al.
U.S. Appl. No. 15/662,805, filed Jul. 28, 2017, 2018/0032782 A1, Jean-Francois Mainguet, et al.
U.S. Appl. No. 15/662,778, filed Jul. 28, 2017, 2018/0032781 A1, Jean-Francois Mainguet, et al.

* cited by examiner

PRINT SENSOR WITH GALLIUM NITRIDE LED

TECHNICAL DOMAIN

The invention relates to the field of sensors for taking pictures of a print related to the particular folds of the skin, particularly a fingerprint, but also a palmprint, footprint or phalanx print. These various prints are collectively called papillary prints.

STATE OF PRIOR ART

Prior art includes various papillary print sensors, particularly optical type sensors in which the acquisition of an image of the print simply illuminates the print and makes an acquisition of a near field image.

These optical sensors are usually in the form of a stack comprising a light emitting layer, an array of photodetectors and possibly a transparent protection layer on which the user must place his or her finger.

Patent application FR-1563178 filed on Dec. 21, 2015 describes one example of such a sensor, comprising an array of photodetectors covered by a series of OLED strips parallel to each other.

One objective of this invention is to propose an alternative to such a papillary print sensor.

PRESENTATION OF THE INVENTION

This objective is achieved with a papillary print sensor according to claim 1.

In order to make gallium nitride LEDs and their electronic control circuits, the current process consists of making a set of LEDs on a transfer substrate in a monolithic way, and then reporting the complete assembly onto a second substrate including control circuits, such that each LED has an electrode connected to a metallic track of the control circuits.

This manufacturing process requires a precise alignment of control circuits with the LEDs, during the step in which these two elements are assembled.

In a papillary print sensor, these alignment difficulties are compounded because the position of the LEDs also depends on the position of photodetectors in the matrix photodetector.

Consequently, until now, an expert in the subject would have believed that gallium nitride LEDS could not be used in a papillary print sensor comprising a light emitting device and a matrix photodetector which are interlaced one with another.

However, the inventors had the innovative idea of looking at recent developments in the field of gallium nitride LEDs.

Patent application PCT/FR2016/051140 describes a new method of fabricating a display device comprising a plurality of gallium nitride diodes.

This process comprises the following steps:
report an active diode stack comprising at least first and second semiconducting doped layers with opposite types of conductivity on a face of integrated control circuits comprising a plurality of metallic connection tracks, such that the second layer in the stack is electrically connected to the metallic tracks of the control circuits; and
form trenches in the active stack delimiting a plurality of diodes connected to metallic tracks distinct from the control circuits.

The positions of LEDs in the active stack have not yet been defined at the time of the step in which the active stack is reported onto a substrate comprising the control circuits. Therefore there is no strong constraint in terms of alignment precision at the time of the report. Delimitation of LEDs in the active stack can then be made by structuring processes providing a significantly better alignment precision than is possible by transferring one substrate onto another.

It then becomes possible to think about making a papillary print sensor comprising one or several gallium nitride LED(s), and particularly one or several gallium nitride LED(0)s interlaced with photodetectors of a matrix photodetector, and controlled by control circuits preferably in CMOS technology.

The use of a CMOS technology makes it possible to limit the overall size of control circuits in the print sensor.

Due to the high alignment precision of LEDs on the substrate, the print sensor may comprise gallium nitride LEDs distributed at a very small pixel pitch, for example 50.8 µm or less.

A small LED distribution pitch is an advantage for the use of methods of detecting living tissues, to recognise whether or not a print is composed of living human tissue.

A small LED distribution pitch is also an advantage for the addition of an emission display function to the papillary print sensor.

The high LED alignment precision also means that a gallium nitride LED can be positioned in a restricted space between two photodetectors.

In particular, a gallium nitride LED can be positioned between photodetectors of the matrix photodetector, even though said photodetectors are distributed at a very small pixel pitch (for example 50.8 µm, or even 25.4 µm or less).

The light emitting device and the matrix photodetector can thus be interlaced, while having good detection resolution and without eliminating pixels from the matrix photodetector.

In particular, the light emitting device can be interlaced with a matrix photodetector with a very low pixel pitch, this low pixel pitch resulting in smaller dimensions of the print sensor, for equal performances.

Since there is no overlap between the light emitting device and the matrix photo detector, increasing the area of the substrate used for the gallium nitride LEDs reduces the area available for photo detectors.

A gallium nitride LED can provide very high light emission powers, despite a small surface area, due to his high efficiency (much higher than the efficiency of OLEDs).

Therefore a large amount of the surface area of the substrate can be used for photodetectors, while maintaining a sufficient light emission power. Thus, a high sensitivity papillary print sensor is formed, the quantity of the detected optical signal being directly related to the surface area occupied by the photodetectors.

For example, the light emitting device occupies a surface area on the substrate equal to at least ten times less than the surface area occupied by the matrix photodetector, and even at least fifty times less.

These high light emission powers also make it possible for gallium nitride LEDs to be distributed at a larger distribution pitch than photodetectors.

The higher energy efficiency of a gallium nitride LED also makes it possible to minimise an electrical consumption of the papillary printer sensor.

The papillary print sensor according to the invention advantageously comprises a protection layer covering the light emitting device and the matrix photodetector, thus forming the outermost layer of the papillary print sensor on the side opposite the substrate.

As a variant, the outermost layer of the papillary print sensor, on the side opposite the substrate, is for example a conducting layer that is also used for protection against electrostatic discharges.

The matrix photodetector extends on a surface called the capture surface of the papillary print sensor, interlaced with the light emitting device. The capture surface area may for example be between 3×3 mm² and 12×12 mm², for example 4×4 mm², or 7×7 mm², or 10×12 mm².

In operation, the gallium nitride LEDs emit light radiation towards the print, and radiation is back scattered by the print and received by the photodetector, sensitive to at least part of the emission spectrum of the gallium nitride LEDs.

Other advantageous and optional characteristics of a papillary print sensor according to the invention are mentioned below, and/or in claims 2 to 13.

In particular, the invention relates particularly to a papillary print sensor comprising a light emitting device and a matrix photodetector, interlaced one with the other in and/or above a same semiconducting substrate, in which:
- the light emitting device is composed of several gallium nitride light emitting diodes, called gallium nitride LEDs, or a single gallium nitride LED with a series of through openings; and
- the substrate receives control circuits comprising a plurality of metallic connection tracks, each gallium nitride LED extending above a metallic track of the control circuits.

The light emitting device and the matrix photodetector are interlaced, in other words they are nested together, or interwoven, or interlocked, without overlap between a gallium nitride LED of the light emitting device and a photodetector of the matrix photodetector.

In other words, the light emitting device and the matrix photodetector are interwoven, without overlap between a gallium nitride LED of the light emitting device and a photodetector of the matrix photodetector.

Preferably, the light emitting device is then composed of several gallium nitride LEDs each extending between photodiodes of the matrix photodetector, or a single gallium nitride LED with a series of through openings in which photodiodes of the matrix photodetector extend.

Advantageously, the matrix photodetector extends in a first stage of the papillary print sensor, and the light emitting device extends in a second stage of the papillary print sensor, above said first stage.

In other words, the papillary print sensor comprises successively a first stage in which the matrix photodetector extends, and a second stage in which the light emitting device extends, the second stage extending above the first stage, superposed on it along a vertical axis (Oz).

The vertical axis (Oz) is defined as being an axis orthogonal to the plane of the substrate.

In other words again, the matrix photodetector extends along a surface called the capture surface of the papillary print sensor, and the vertical axis (Oz) is defined as an axis orthogonal to said capture surface.

This vertical axis is oriented from the substrate towards a contact surface of the papillary print sensor. Thus, the second stage is closer to the contact surface than the first stage, along this vertical axis. The contact surface of the papillary print sensor is an external surface of the sensor, designed to come into direct physical contact with the papillary print to be imaged, during operation.

Advantageously, the gallium nitride LED(s) of the light emitting device is (are) offset longitudinally and transversely from the photodetectors in the matrix photodetector. The longitudinal and transverse axes correspond to the (Ox) and (Oy) axes in the (Oxy) plane parallel to the capture surface of the matrix photodetector.

In particular, the gallium nitride LED(s) forming the light emitting device is (are) offset longitudinally and transversely from the photodiodes forming the photodetectors in the matrix photodetector, such that at least part of the light emitting device does not cover the photodiodes.

Preferably, there is no overlap between a gallium nitride LED of the light emitting device and a photodetector of the matrix photodetector.

Preferably, the light emitting device is composed of several gallium nitride LEDs distributed in a distribution array with N rows and M columns, where N and M are integers greater than 3 and possibly being equal.

As a variant, the light emitting device is composed of several gallium nitride LEDs, each in the form of a strip, distributed in one or two columns of strips parallel to each other.

The papillary print sensor according to the invention may comprise walls, each extending between at least one gallium nitride LED forming part of the light emitting device, and a photodiode belonging to the matrix photodetector, each wall being reflective at a central emission wavelength of said gallium nitride LED.

According to one advantageous embodiment, the light emission device is polychromatic, at least some of the gallium nitride LEDs comprising an active LED stack covered by one or several photoluminescent conversion stack(s).

A conducting layer forming an upper LED electrode and an upper electrode for a pyroelectric material is preferably made of indium-tin oxide.

The invention also relates to a method of manufacturing a papillary print sensor according to the invention as defined in claim 15.

In particular, it concerns a method comprising the following steps:
a) report an active LED stack comprising at least first and second semiconducting layers doped with opposite types of conductivity on a face of the semiconducting substrate comprising the control circuits, such that the second layer of the stack is electrically connected to the metallic tracks of the control circuit;
b) form trenches in the active stack to delimit several gallium nitride LEDs or to pierce openings passing through the single gallium nitride LED; and
c) make the matrix photodetector in or above the substrate, step c) being implemented before or after steps a) and b).

BRIEF DESCRIPTION OF THE DRAWINGS

This invention will be better understood after reading the description of example embodiments given purely for information and that are in no way limitative, with reference to the appended drawings on which.

DETAILED PRESENTATION OF PARTICULAR EMBODIMENTS

For reasons of clarity, only the elements useful for an understanding of the described embodiments are represented and described. In particular, control circuits are not detailed, since the invention does not lie in these control circuits. For the same reason, the composition of stacks forming the gallium nitride diode(s) is not detailed.

In the following description, the terms "on", "above", "under", "below" relate to the orientation of the corresponding figures. To clarify matters, the (Ox), (Oy) and/or (Oz) axes of an orthonormal coordinate system are shown on some of the figures. The (Oz) axis is the vertical.

Figure 1:
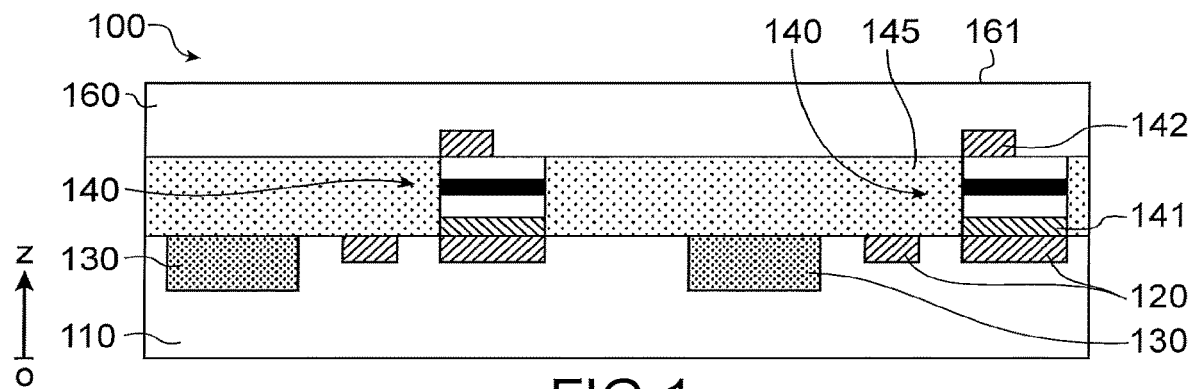
FIG. 1 diagrammatically illustrates a sectional view of a first embodiment of a print sensor according to the invention.

FIG. 1 diagrammatically illustrates a sectional view of a first embodiment of a papillary print sensor 100 according to the invention. The print sensor 100 comprises a semiconducting substrate 110, for example made of silicon, comprising control circuits (not shown) preferably made from a CMOS technology. The control circuits comprise metallic connection tracks 120, making the electrical connection between these control circuits and the electronic devices mounted on the substrate. Each of the metallic connection tracks 120 is formed from a thin metallic layer buried in the substrate 110, and flush with its top surface.

A plurality of photodiodes 130 extends directly in the substrate 110. The photodiodes 130 are formed by simple PN junctions, and extend directly into the silicon of the substrate 110. Each photodiode 130 is formed by implantation of dopants in the silicon, and is connected to control circuits by means known to an expert in the subject such that light rays incident on a top face of the substrate reach the corresponding PN junction.

The photodiodes 130 are arranged in a rectangular, preferably square, distribution array and in combination form a matrix photodetector. The photodiodes 130 cover together a surface called the capture surface of the papillary print sensor. The capture surface extends in an (Oxy) plane, as shown on FIG. 1. The resolution of the matrix photodetector is preference 500 dpi, namely a pixel pitch of 50.8 µm. As a variant, this resolution is 1000 dpi (namely a pixel pitch of 25.4 µm) or even 2000 dpi (namely a pixel pitch of 12.7 µm).

Gallium nitride LEDs 140 extend above the substrate, each covering a single metallic track 120 of the substrate. Throughout the remaining description, gallium nitride LEDs are more simply denoted GaN LEDs. Preferably, a vertical projection (along Oz)) of a GaN LED 140 coincides with the extent of the corresponding metallic track 120. Said metallic track 120 makes the connection between a lower electrode of the corresponding GaN LED and control circuits in the substrate 110. It will thus be understood that the control circuits will control the GaN LEDs 140.

Each GaN LED 140 in this description comprises an active LED stack comprising at least first and second doped semiconducting layers with opposite types of conductivity. Preferably, these two semiconducting layers are separated by an emissive layer, for example based on quantum wells, or with so-called intrinsic doping.

Advantageously, each GaN LED 140 and the corresponding metallic track 120 are separated by a metallic pad 141. The metallic pad 141 is in direct physical contact with the metallic track 120 on one side and with the GaN LED 140 on the other side. The section of the metallic pad 141 is the same as the section of the active stack of the GaN LED, in an (xOy) plane parallel to the plane of the substrate. The metallic pads 141 originate from a step advantageously implemented in the fabrication of gallium nitride LED(s) according to the method described in the presentation of the invention. This step consists of covering the active LED stack and/or the substrate comprising the control circuits, with a metallic layer, before the active LED stack is reported. This metallic layer can improve and/or facilitate attachment of the active LED stack on the substrate comprising the control circuits. When trenches are etched to delimit a plurality of diodes (or to form the structure of a single diode), the metallic layer is structured with the active LED stack which forms the metallic pads 141. If applicable, metallic connection layers 120 of the CMOS substrate can be etched during the same etching step, such that these tracks do not project at the side of a GaN LED.

GaN LEDs 140 form together light emitting means, also called a light emitting device. In this embodiment, they are distributed on the substrates 110 in which the photodiodes 130 are formed, without covering the photodiodes. In other words, the GaN LEDs 140 and the photodiodes 130 are not superposed on each other along the (Oz) axe. Thus, the GaN LEDs 140 are offset from the photodiodes 130 in the longitudinal and transverse directions (in other words along the (Ox) and (Oy) axes).

Different examples of the distribution of the photodiodes 130 and GaN LEDs 140 are described below, wherein the matrix photodetector and the light emitting device 140 are interlaced.

The spaces between the GaN LEDs 140 are filled with a transparent electrical insulator 145. In other words, GaN LEDs 140 at a distance from each other are separated by the transparent electrical insulator 145. Through the text, the term transparent implies a transmission coefficient of more than 80% or even more than 90% at the emission wavelength of the GaN LEDs 140 (or possibly at the respective emission wavelengths of each of the different types of GaN LED). For example, the electrical insulator 145 is silicon oxide. The assembly of the GaN LEDs 140 and the electrical insulator 145 forms an additional stage of the papillary print sensor 100. An additional stage means one stage more than the semiconducting substrate 110 integrating the photodiodes 130. In this case, the electrical insulator 145 entirely fills the spaces between the GaN LEDs 140, the GaN LEDs 140 and the electrical insulator 145 together forming a layer with no openings.

As illustrated in FIG. 1, the papillary print sensor 100 comprises a sequence along the direction of the Ox axis consisting of a first stage comprising the semiconducting substrate 110 in which the photodiodes 130 are formed, and a second stage comprising the transparent electrical insulator 45, in which the GaN LEDs 140 are located. It will then be understood that the first stage is underneath the second stage and therefore the photodiodes 130 are underneath the GaN LEDs.

Each of the GaN LEDs 140 is covered with an upper electrode 142 made of a conducting material such as metal or indium tin oxide. The upper electrodes 142 are connected to a metallic track of the substrate through a via (not shown) that passes through said additional stage of the print sensor 100.

The assembly is covered with a thin transparent protection layer 160, providing protection against repeated contacts with human tissues. The protection layer 160 can be an electrical conductor or an insulator, depending on whether it covers electrodes brought to the same potential or to different potentials. The protection layer 160 may be composed of an oxide layer, an epoxy polymer (epoxy paint) layer, or an amorphous carbon layer called "Diamond-Like Carbon" (DLC), etc. Advantageously, its thickness is less than 30 µm, and even less than 20 µm, or even less than 1 µm for DLC. It forms the outermost layer of the print sensor 100, on the side opposite the semiconducting substrate 110. It can thus be understood that the papillary print sensor 100 comprises a third stage comprising the protection layer 160, located above the second stage comprising the transparent electrical insulation 145 in which the GaN LEDs 140 are located, along the direction of the Oz axis.

During operation, a print is pressed in contact with a contact surface 161 of the print sensor, on an external face of the protection layer, on the side opposite the substrate 110. The GaN LEDs 140 emit light radiation towards the protection layer 160 that is back scattered by the print. The back scattered radiation is received by the photodiodes 130, that are sensitive on at least part of the emission spectrum of the GaN LEDs 140.

A distance between the contact surface 161 and the photodiodes 130 is preferably less than the distribution pitch of the photodiodes, for example less than or equal to 50.8 µm, and even less than or equal to 25 µm. For example, this distance is measured along the Oz axis. The print sensor according to the invention can thus form a compact device functioning in near field, without any focussing means placed between the contact surface and the photodiodes 130. The photodiodes are advantageously distributed in a square array. If they are distributed in a rectangular array, the smallest of the two pitches defining the distribution of the photodiodes will be considered. Advantageously, a distance is measured between the contact surface 161 and the photodiodes 130, from a plane containing the upper electrodes of the photodiodes (in this case, the top face of the semiconducting substrate, on the side of the contact surface).

FIGS. 2A to 2D illustrate different variant distributions of the GaN LEDs 140 and the photodiodes 130, shown in a top view. In each of these variants, the photodiodes 130 are set out in a square array (or matrix) with pitch P, in which P is for example equal to 50.8 µm, or 25.4 µm, or even less. The photodiodes array may for example be a square with a side of at least 100 pixels.

Figure 2A:
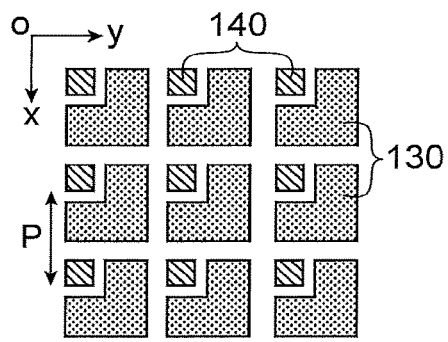
FIGS. 2A to 2D diagrammatically illustrate top views showing different LED and photodetector distribution variants in a print sensor according to the invention.

On FIG. 2A, the light emitting device is composed of a plurality of GaN LEDs 140, distributed in a square distribution array (or matrix) with the same pitch P. An array distribution also makes it possible for the GaN LEDs 140 to form an emission display device (in this case a monochrome display device). In order to maximise a capture surface of the papillary print sensor, each photodiode 130 has an indent visible on a top view, inside which there is a GaN LED 140. In particular, each GaN LED 140 has a square shape, arranged inside a hollow of a L-shaped photodiode 130.

A GaN LED can emit high optical powers, even with very small dimensions. Thus, each GaN LED can be square or rectangular as seen in a top view, with a side of less than 10 µm, for example 4 µm or 3 µm or 2 µm. The small dimensions of each GaN LED are such that they are distributed at a small pixel pitch, without preventing good signal detection by the photodiodes.

Figure 2B:
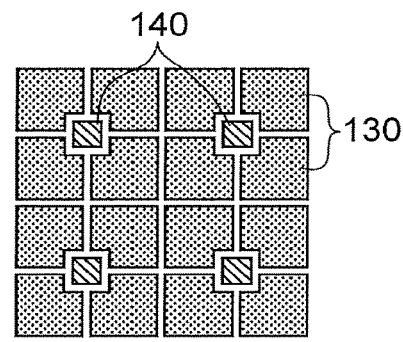

The variant illustrated on FIG. 2B is different from that on FIG. 2A in that the distribution pitch of the GaN LEDs 140 is an integer multiple of the distribution pitch of the photodiodes 130. The GaN LEDs 140 can still form an emission display device, for example allowing displaying simple patterns such as a cross when the print sensor is ready to receive a print, or when a print has been correctly detected. Each GaN LED 140 is arranged here at the corner of four photodiodes 130. Each photodiode 130 has in indent inside which there is a corner of a GaN LED 140. With this variant, a very small pixel pitch of the matrix photo-detector forming a high-resolution print sensor, can be combined with a higher pixel pitch for the GaN LEDs, providing sufficient illumination for detection of the print and capable of forming a high quality emission display device. For example, the resolution of the matrix photodetector is 2000 dpi, whereas the resolution of the GaN LED array is 300 dpi. In some variants not shown, the distribution of GaN LED does not have the same pitch everywhere.

As a variant, the photodiodes and the GaN LED are distributed in a rectangular array. The GaN LEDs can then be distributed at the same distribution pitch as the photodiodes, along each dimension of the plane of the matrix photodetector. Alternatively, the distribution pitch of the GaN LEDs along each dimension in the plane of the matrix photodetector is a multiple of the distribution pitch of the photodiodes.

Figure 2C:
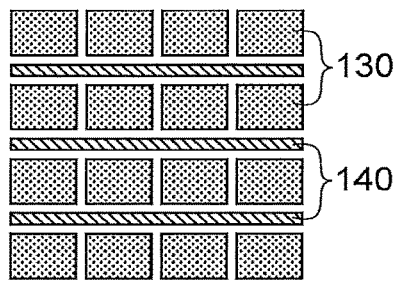

On FIG. 2C, each GaN LED is in the form of a strip and extends between two rows of photodiodes 130, from one side of the capture surface defined by all the photodiodes 130 to the other. The GaN LEDs can then be connected to the control circuits, only from the edge of the print sensor. This variant can form illumination figures composed of light bands and dark bands. Patent application FR-1563180 filed on Dec. 23, 2015, describes a method of recognising living tissue, using such illumination figures to determine a coefficient of absorption and a coefficient of reduced diffusion characteristic of a print, and thus recognise whether or not the print is composed of living human tissue. Therefore this variant is particularly advantageous to recognise whether or not a print is composed of living human tissue, from its response to predetermined illumination. The term "strip" as used herein denotes any elongated pattern such as a long rectangle, a zigzag, a line of triangles, etc. For example, the width of a strip in the form of a long rectangle may be less than or equal to 4 µm, and its length may be several hundred µm, or even several millimetres, advantageously the entire length of the capture surface.

According to one variant not shown, the light emitting device is composed of two columns of LED strips. Each column may be connected to control circuits from a corresponding edge of the print sensor.

Figure 2D:
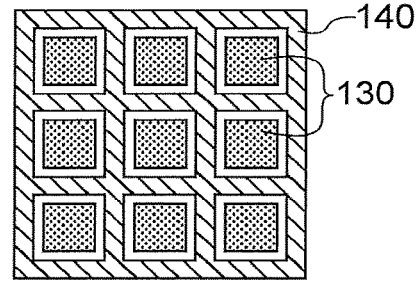

On FIG. 2D, the light emitting device is composed of a single GaN LED 140, in the form of a grid. There is one photodiode 130 in each opening in the grid. This variant has particularly simple connections for the light emitting device (but obviously it cannot form an emitting display). Each opening in the grid can also contain several photodiodes.

In each of the variants described above, GaN LEDs extend between photodiodes, or photodiodes extend in the holes of a grid-shaped LED. The GaN LED(s) thus form(s) a light emitting device interlaced with a matrix photodetector. Therefore, "interlaced" means that each of the GaN LEDs 140 extends between the photodiodes 130 of the matrix photodetector without any overlap, or that in the case of a single GaN LED 140 in the form of a grid with openings in it, the openings will contain the photodiodes 130 of the matrix photodetector.

In an extreme case, the print sensor according to the invention is a scan sensor, comprising only a few rows of photodiodes and one row of GaN LEDs.

The light emitting device may be polychromatic, in other words capable of emitting at different wavelengths, for example three wavelengths such as red, blue or green. The light emitting device may be composed of different types of active LED stacks, each of which has a different emission wavelength. According to one advantageous variant, the light emitting device is composed of a plurality of active LED stacks all of which have the same emission spectrum, and at least some of which are covered by one or several photoluminescent conversion stacks.

The assembly composed of an active LED stack and possibly the corresponding photoluminescent conversion stack(s) is then called a "GaN LED". The light emitting device can then be made using the method described in French patent application No. 16 54282. This method comprises steps to deposit and etch different types of photoluminescent conversion stacks, above a series of active LED stacks based on gallium nitride.

Figure 3A:
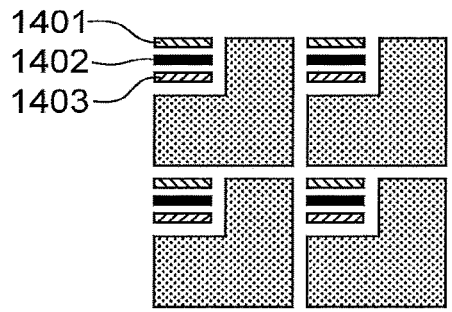
FIGS. 3A and 3B diagrammatically illustrate top views showing different embodiments of polychromatic illumination devices, in a print sensor according to the invention.
Figure 3B:
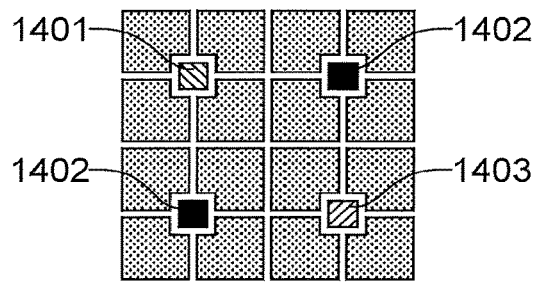

FIGS. 3A and 3B illustrate two example embodiments of polychromatic light emitting devices.

On FIG. 3A, the GaN LEDs are distributed in blocks of three LED, in a square distribution array. Each block comprises three directly adjacent GaN LEDs (1401, 1402, 1403), emitting in the red, blue and green respectively.

On FIG. 3B, the GaN LEDs are distributed in a square distribution array, the LEDs being alternately a GaN LED (1401) emitting in the red, or a GaN LED emitting in the blue (1402), or a GaN LED emitting in the green (1403).

Many other variants can be used. For example, the GaN LEDs can be in the form of strips, the strips alternately being red, blue or green. Colours other than red, blue and green can also be used. A polychromatic light emitting device is advantageous for the implementation of methods of recognising living tissue. They can also form a colour emissive display.

Advantageously, the print sensor comprises means (not shown) of preventing radiation emitted by a GaN LED from being directly received by an adjacent photodiode, without first being back scattered on a print. For example, walls can extend between a GaN LED and adjacent photodiodes, reflecting at the central emission wavelength of said GaN LED. A wall is said to be reflecting when it has a coefficient of reflection of more than 70%, and even 80%, at said central emission wavelength. Said walls may for example be formed by annular shaped metallic studs each surrounding a GaN LED, or by metallic barriers each extending in a straight line on each side of a GaN LED in the form of a strip.

Additionally or as a variant, the GaN LEDs are arranged to emit a collimated light beam. To achieve this, the active LED stack may comprise Bragg mirrors forming a Resonant Cavity LED (RCLED). To avoid blinding the photodiodes, another solution consists in turning on the GaN LEDs sequentially and reading only photodiodes located at a distance from an turned on GaN LED.

Figure 4:
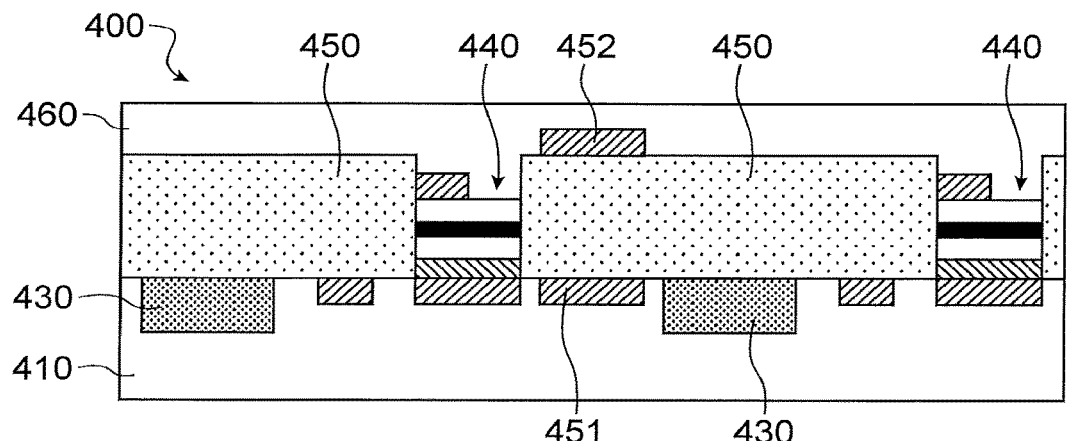
FIG. 4 illustrates a second embodiment of a print sensor according to the invention, in which the light emitting device is interlaced with pyroelectric conversion elements.

FIG. 4 illustrates a particularly advantageous embodiment in which the light emitting device is interlaced with pyroelectric conversion elements. Only the differences between the print sensor 400 in FIG. 4 and the embodiment in FIG. 1 will be described.

The print sensor 400 in FIG. 4 comprises a structured layer 450 of pyroelectric material, extending with the GaN LEDs 440 in the additional stage of the print sensor as described above, on top of the substrate 410. The pyroelectricity of a material is its ability to generate electrical charges called pyroelectric charges, in response to a temperature variation. For example, the pyroelectric material may be a copolymer of polyvinylidene fluoride (PVDF-TrFE), or a III-V nitride such as aluminium nitride, or a mix of nitrides including aluminium nitride.

Pyroelectric materials are inherently good electrical insulators, such that the structured layer 450 made of a pyroelectric material advantageously replaces the electrical insulator 145 used in the first embodiment. The structured layer 450 made of a pyroelectric material must also be transparent, to allow light to pass to the photodiodes 430. To achieve this, the structured layer 450 made of a pyroelectric material may be thin, for example thinner than 1 µm, and/or composed of a transparent pyroelectric material such as PVDF-TrFE. In the following, the structured layer 450 made of a pyroelectric material is simply called "pyroelectric material".

The pyroelectric material 450 extends in the spaces between the GaN LED 440 (or in the through openings of a single GaN LED). In this case, the pyroelectric material 450 with the GaN LEDs 440 form a layer extending above the substrate without any openings. Preferably, the pyroelectric material 450 does not cover the GaN LEDs 440. As a variant, the pyroelectric material 450 can form distinct strips, between the GaN LEDs.

The case shown is the case in which the pyroelectric material 450 projects above the GaN LEDs, the thickness of the pyroelectric material being for example between 2 and 3 µm, while the thickness of the GaN LEDs is about 0.5 µm.

The pyroelectric material 450 covers a set of metallic tracks 451 flush with the upper surface of the substrate 410, together forming an array of lower electrodes of the pyroelectric material. The pyroelectric material 450 is also covered by a set of conducting tracks 452 each located facing a lower electrode 451 of the pyroelectric material, and together forming an array of upper electrodes made of the pyroelectric material. If the upper electrodes 452 are not transparent at the emission wavelength of the GaN LEDs, they extend on the pyroelectric material without covering the photodiodes, as shown on FIG. 4.

The lower and upper electrodes and the pyroelectric material form together an array of pyroelectric conversion elements.

Each pyroelectric conversion element comprises:
an upper electrode 452, connected to a constant potential source, for example to the ground (or even to the earth);
a lower electrode 451, connected to pyroelectric charge measurement circuits (not shown); and a portion of pyroelectric material, directly interposed between these electrodes, that will be exposed to a temporal temperature variation and that can generate pyroelectric charges between these electrodes, corresponding to said temperature variation.

These pyroelectric conversion elements together form an array of temporal temperature variation transducers, and particularly a thermal type of papillary print sensor that is capable of discriminating between pyroelectric conversion elements above which there is a ridge and above which there is a valley of a print.

Thus, a print sensor is made in which the light emitting device is interlaced with the pixels of a thermal sensor, so as to provide optical and thermal measurements belonging to the same region of a print.

Optical measurements can thus be consolidated and/or completed and/or corrected by temperature measurements, to provide a better quality image. For example, optical measurements made on a dry finger are complemented by temperature measurements, that are more reliable on a dry finger. Temperature measurements are obtained without significantly increasing the size of the print sensor, since the pyroelectric conversion elements are made principally be replacing all or some of an electrical insulator by a material that also has pyroelectric properties.

Preferably, a distribution pitch of the pyroelectric conversion elements is equal to a distribution pitch of the photodiodes 430.

The pyroelectric charge measurement circuits are advantageously integrated into the substrate 410, made using the CMOS technology, and make use of passive measurement techniques (current reading of charges) or active measurement techniques (voltage reading), with a series of transistors. The pyroelectric charge measurement circuits and the measurement circuits for reading photodiodes can be distinct, or they can be shared using one or several transistors to switch charges. A selection circuit can be used to control each LED individually at pixel level.

The pyroelectric conversion elements and the GaN LEDs are covered by a second transparent electrical insulating layer 460. Preferably, this second electrical insulating layer 460 also provides protection against repeated contacts with human tissues. For example, it may be made of DLC.

According to one variant, not shown, the different pyroelectric conversion elements share the same upper electrode extending above the lower electrodes array.

According to another variant, the upper electrodes are connected to the measurement circuits, the lower electrode(s) being connected to a constant potential source.

According to another variant, the pyroelectric material and the GaN LEDs extend to the same height above the substrate. The smallest thickness of pyroelectric material is then compensated by high sensitivity of the measurement circuits integrated in CMOS technology into the substrate, and for example comprising an amplifier for each pyroelectric conversion element.

According to another variant, the pyroelectric material extends into through openings etched in a distinct electrical insulator, between the GaN LEDs (or in the through openings of a single GaN LED).

In another variant, the pyroelectric material extends in a single piece without any openings above the substrate, a thin layer of pyroelectric conversion material then covering the GaN LEDs.

Charges can accumulate when the finger is in contact with the print sensor, possibly provoking an electrostatic discharge. Preferably, the print sensor according to the invention also comprises a protection from electrostatic discharges.

Figure 5:
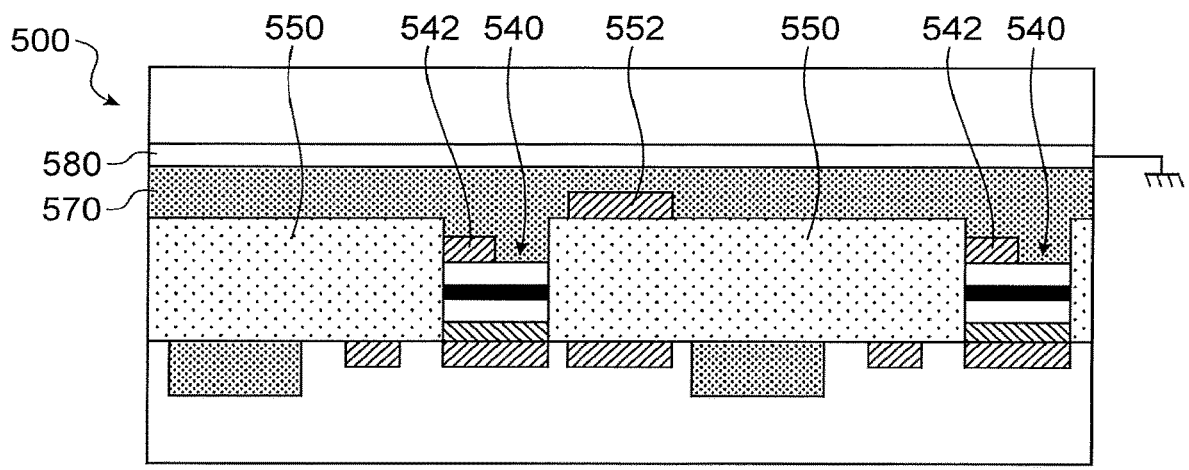
FIG. 5 illustrates a first variant of the embodiment in FIG. 4, also comprising a conducting layer providing protection from electrostatic discharges.

Only the differences between the print sensor 500 in FIG. 5 and the embodiment in FIG. 4 will be described. In this print sensor 500, the GaN LEDs 540, the pyroelectric material 550 and their upper electrodes 542, 552 respectively, are covered by a second transparent electrically insulating layer 570, such as silicon oxide.

The second electrical insulator 570 is itself covered by a conducting layer 580 connected to a constant potential source (preferably the ground, and even more preferably the earth) to protect the print sensor from electrostatic discharges. This conducting layer also forms electromagnetic shielding, particularly from electromagnetic radiation at 50 or 60 Hz. The conducting layer 580 is composed of a transparent and electrically conducting material, preferably indium-tin oxide (ITO). It is a few hundred nanometres thick, preferably less than 1 μm. The conducting layer 580 extends without any openings above the substrate, covering all the photodiodes of the matrix photodetector and the entire light emitting device. It is itself covered by an optional protection layer 560, as described with reference to FIG. 1.

Figure 6:
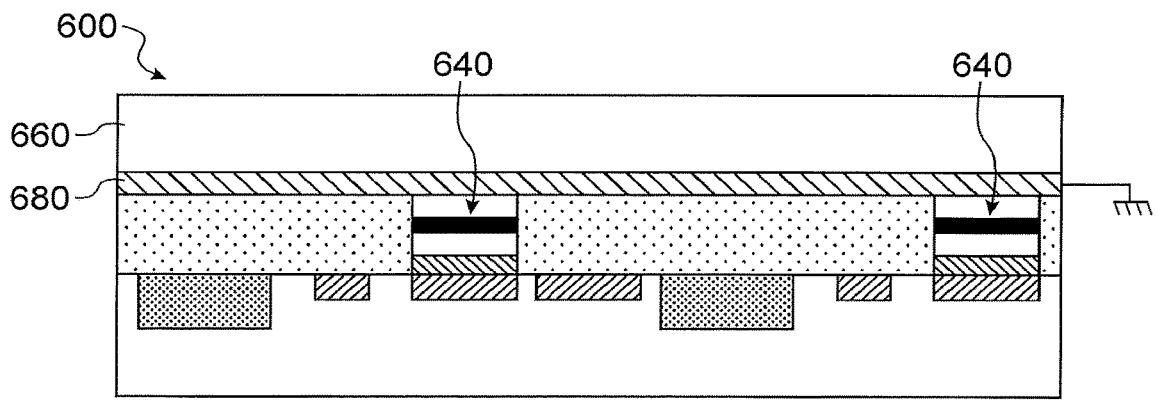
FIG. 6 illustrates a second variant of the embodiment in FIG. 4, in which the electrodes of the print sensor according to the invention form a conducting layer providing protection from electrostatic discharges.

FIG. 6 illustrates a variant of a print sensor 600 according to the invention, in which the upper electrodes of the GaN LEDs and the upper electrodes of the pyroelectric conversion elements are formed together in a single piece-. One solution consists of replacing the plurality of upper electrodes by a single metallic layer through which through openings are formed to allow light to reach the GaN LEDs and the photodiodes.

FIG. 6 illustrates a more ingenious solution in which a single conducting layer 680 extends in a single piece without any openings above the substrate, in direct physical contact with the LED stacks and the pyroelectric material. The conducting layer 680 extends above all the photodiodes of the matrix photodetector and the entire light emitting device. This single conducting layer 680 is composed of a transparent and electrically conducting material, preferably indium-tin oxide (ITO).

This single conducting layer 680 is connected to a constant potential source, preferably the ground and even more preferably the earth. It forms the upper electrodes of the GaN LEDs 640, and the upper electrodes of the pyroelectric conversion elements. Since it does not have any through openings, it also forms efficient electromagnetic shielding above the substrate, providing good protection against electrostatic discharges. This variant is particularly advantageous with a pyroelectric material that does not have to be polarised before use, for example aluminium nitride, or a mix of nitrides including aluminium nitride. If the pyroelectric material has to be polarised, the direction of polarisation must be chosen so as to protect the transistors in the CMOS control circuits. This variant is particularly advantageous when the pyroelectric material and the GaN LEDs extend to the same height above the substrate.

Preferably, the contact surface of the print sensor is formed on an upper face of the conducting layer 680, or on an upper face of a protection layer 660 that covers the conducting layer directly (as illustrated in FIG. 6).

A print sensor based on the use of a pyroelectric material can be used in different detection modes. A "passive" detection mode makes use of an initial temperature difference between the pyroelectric conversion elements and the print.

At a ridge, the print is in direct physical contact with the contact surface of the sensor, thus driving heat transfer by conduction between the print and a pyroelectric conversion element. The heat transfer is efficient, such that there is a high temperature change in the pyroelectric conversion element in the instants after the print is placed on the contact surface.

At a valley, the print is not in direct physical contact with the contact surface of the sensor. Heat transfer between the print and a pyroelectric conversion element takes place by convection. The heat transfer is less efficient, such that a low temperature change occurs in the pyroelectric conversion element in the instants after the print is placed on the contact surface.

One disadvantage of this type of detection is that the temperatures very quickly stops changing, such that it is no longer possible to take an image of a print. One solution is to move the print relative to the contact surface of the sensor, to delay or prevent thermal equilibrium. The array of pyroelectric conversion elements then forms a rectangular array. Nevertheless, if the print and the pyroelectric conversion elements have the same initial temperature, there will be no temperature variation and therefore no pyroelectric charge will be generated to be measured.

Another "active" detection mode consists of heating the pyroelectric conversion elements. Thus, a thermal disequilibrium is increased and maintained between the pyroelectric conversion elements and the print.

Figure 7:
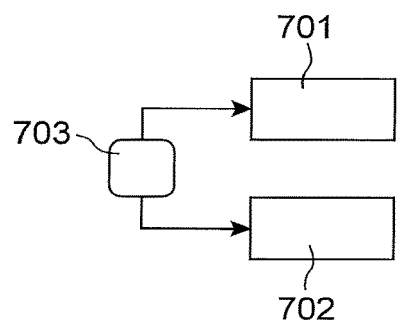
FIGS. 7 and 8 diagrammatically illustrate the principle of an active type of thermal detection, with heating of the pyroelectric conversion elements.
Figure 8:
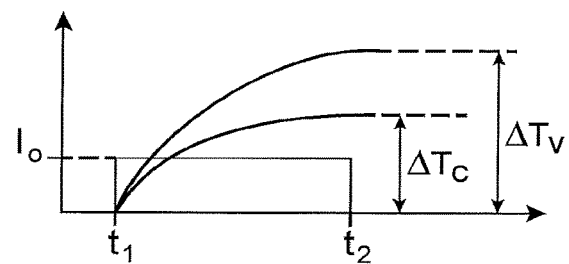

FIGS. 7 and 8 diagrammatically illustrate the principle of an active type of thermal detection.

FIG. 7 very diagrammatically illustrates the device used for each pyroelectric conversion element, comprising:
- an electrical charge measurement device 701 (or in other words means 701 of measuring electrical charges), connected to the pyroelectric conversion element, in this case through its lower electrode-;
- a heating element 702, configured to heat the pyroelectric material of the pyroelectric conversion element; and
- a synchronisation device 703 (or in other words synchronisation means 703), connected to the heating element 702 and to the measurement device 701, configured to drive a charge measurement at predetermined instants after heating is switched on.

FIG. 8 illustrates a current pulse provided to the heating element 702, defined by a constant current $I_0$ between instants $t_1$ and $t_2$, and zero at other times. This current pulse activates heating of the pyroelectric conversion element by the heating element 702, between instants $t_1$ and $t_2$.

When the pyroelectric conversion element is covered by a valley of the print, heat is transmitted to the print by air convection. The efficiency of this heat transfer is lower, such that the temperature of the pyroelectric conversion element increases strongly between instants $t_1$ and $t_2$ (temperature variation $\Delta T_v$).

When the pyroelectric conversion element is covered by a ridge of the print, heat is transmitted to the finger by conduction. The efficiency of this heat transfer is high, such that the temperature of the pyroelectric conversion element increases weakly between instants $t_1$ and $t_2$ (temperature variation $\Delta T_c < \Delta T_v$).

These temperature variations correspond to generated charges measured by the measurement device 701. In practice, the measurement device 701 is reset shortly after $t_1$ to prevent parasites provoked by the start of injection of current $I_0$ and the measurement is made just before $t_2$.

Each heating element is connected to a current source, or a voltage source, configured to supply a heating current and capable of heating said heating element by the Joule effect. Each heating element can consist of a heating resistance. For example, the print sensor comprises a distinct heating resistance above (or below) each pyroelectric conversion element.

According to one advantageous variant, the print sensor includes elongated heating resistances, each extending above (or below) a row of pyroelectric conversion elements. This configuration is well adapted to row by row reading of pyroelectric conversion elements.

Figure 9:
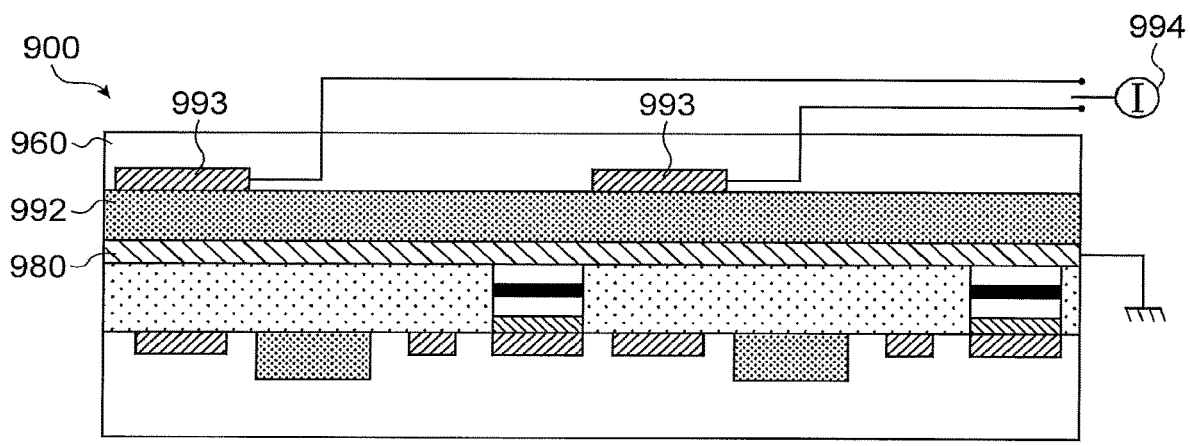
FIG. 9 illustrates a third embodiment of a print sensor according to the invention, comprising means of heating the pyroelectric conversion elements.

FIG. 9 illustrates a third embodiment derived from the embodiment in FIG. 6, in which the single conducting layer 980 is covered by a transparent electrical insulator 992 (for example $SiO_2$, or $Si_3N_4$), itself covered by a plurality of electrical resistances 993.

Each of the electrical resistances 993 is connected to a connection circuit for the connection to a current source 994 outputting a heating current. A protection layer 960 covers the resistances 993 and the electrical insulator 992. Preferably, the electrical resistances 993 extend above the substrate without covering the photodiodes.

According to one embodiment not shown, the heating elements are formed by the upper electrodes of the pyroelectric conversion elements that can be connected alternately to a zero potential or to a current source.

According to another embodiment, not shown, the at least one heating element is formed by the at least one gallium nitride LED of the light emitting device. Preferably, each GaN LED forming the light emitting device is then connected to an energy source that supplies said GaN LED with an electrical power exceeding 0.5 mW. The part of the injected power not converted into light corresponds to heat losses. For example, with an efficiency of 20%, 80% of the power is converted into heat, that is used to heat the pyroelectric elements. It is then pointless to insert a specific resistance for heating.

According to this embodiment, the synchronisation device as described with reference to FIG. 7 is connected to the GaN LEDs, to control the measurement of pyroelectric charges at predetermined instants after switching on one or several GaN LED(s) of the light emitting device.

A print sensor in which a stage containing the light emitting device extends above a substrate containing the matrix photodetector is described above. As a variant, a single stage can contain both the light emitting device and the matrix photodetector, above the substrate. The matrix photodetector is then composed of photodiodes produced by report or by specific deposits on the substrate.

For example, each photodiode forming part of the matrix photodetector is a "Positive Intrinsic Negative" (PiN) diode composed of an undoped (intrinsic I) zone, intercalated between two zones doped P respectively N. One of the advantages of this type of photodiode is its high sensitivity. The PiN diodes are reported or deposited on the substrate before or after production of the at least one GaN LED and before deposition of the pyroelectric material.

Figure 10:
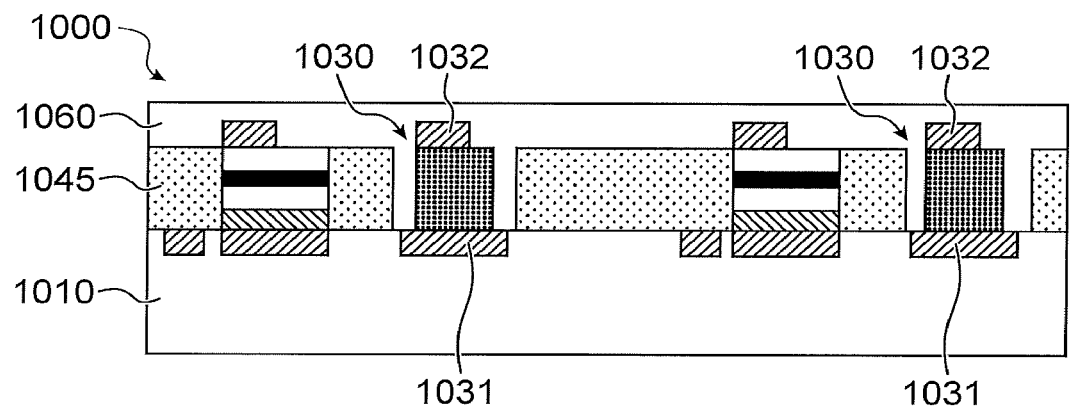
FIGS. 10 and 11 illustrate two variants of a fourth embodiment of a print sensor according to the invention, in which the matrix photodetector is composed of a PiN diode array.
Figure 11:
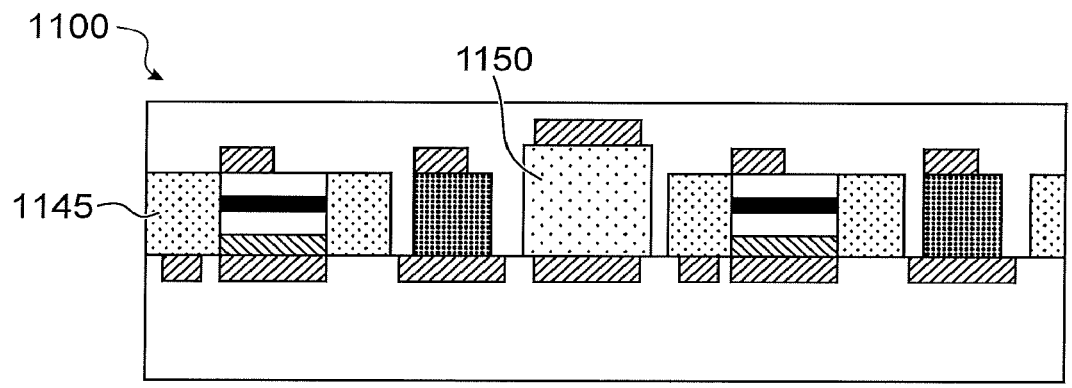
Figure 12:
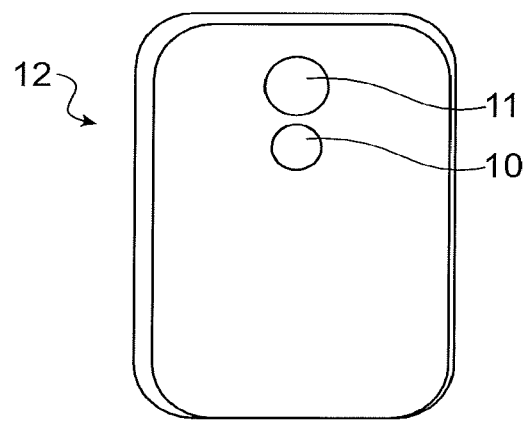
FIG. 12 diagrammatically illustrates an advantageous application of the print sensor according to the invention.

FIGS. 10 and 11 illustrate two variants in which the matrix photodetector is composed of a PiN diode array. Only the differences between the print sensor 1000 and the print sensor in FIG. 1 will be described.

In this case, the matrix photodetector is composed of PiN diodes 1030, each extending above a dedicated metallic track 1031 of the substrate 1010, and each covered with metallisation 1032 forming the upper electrode. Each PiN diode 1030 extends in a through opening etched in a first electrical insulator 1045.

A second transparent electrical insulator 1060 extends in a single piece and without any openings above the substrate 1010, covering the PiN diodes 1030 and the GaN LEDs, and filling in the remaining spaces between a PiN diode 1030 and the first electrical insulator 1045. The second electrical insulator 1060 also forms a protective layer against repeated contacts with human tissues.

The print sensor 1100 in FIG. 11 corresponds to the print sensor in FIG. 10, and also comprises an array of pyroelectric conversion elements. Each pyroelectric conversion element extends in a through opening etched in the first electrical insulator 1145, a single through opening being able to contain both a pyroelectric conversion element and a PiN diode. The pyroelectric material 1150 does not have to be transparent, since it is located at the side of the photodiodes and not on top of them.

Many other variants of the invention can be used, in which the matrix photodetector is composed of PiN diodes added onto the substrate. In particular, the examples described with reference to FIGS. 1 to 9 can be adapted to a matrix photodetector composed of PiN diodes.

One particularly advantageous application of the invention is in a smart phone 12 equipped with a camera 11 and a print sensor 10. The light emitting device of the print sensor 10 is composed of at least one GaN LED, and it can provide sufficiently powerful illumination to also form a flash for the camera 11. The substrate that contains the print sensor can also contain one or several specific GaN LED(s) that will more specifically be used to form a flash for the camera.

The invention claimed is:

1. A papillary print sensor, comprising:
   a light emitting device and a matrix photodetector interlaced together in a same semiconducting substrate and/or above a surface of the same semiconducting substrate,
   the light emitting device being oriented in and/or above the surface of the same semiconducting substrate such that the light emitting device is configured to emit light radiation towards a contact surface of the papillary print sensor along an axis orthogonal to the contact surface,
   the matrix photodetector being sensitive to at least part of an emission spectrum of the light emitting device, and being oriented in and/or above the surface of the same semiconducting substrate such that the matrix photodetector is configured to detect light radiation backscattered through the contact surface,
   wherein the light emitting device is composed of at least one gallium nitride light emitting diode (LED),
   wherein the matrix photodetector extends on a capture surface of the papillary print sensor, and
   wherein the light emitting device occupies a surface area on the semiconducting substrate equal to at least ten times less than a surface area occupied by the matrix photodetector.

2. The papillary print sensor according to claim 1,
   wherein the matrix photodetector extends along a capture surface of the sensor, in a first stage of the sensor,
   wherein the light emitting device extends in a second stage of the sensor, and
   wherein the second stage extends above the first stage, the second stage being superposed above the first stage along an axis orthogonal to a plane of the capture surface.

3. The papillary print sensor according to claim 2, wherein the same semiconducting substrate contains the matrix photodetector and forms the first stage of the sensor.

4. The papillary print sensor according to claim 1, wherein the same semiconducting substrate includes control circuits comprising a plurality of metallic connection tracks, the at least one gallium nitride LED extending above a metallic track of the control circuits.

5. The papillary print sensor according to claim 1, wherein the at least one gallium nitride LED is offset from photodetectors of the matrix photodetector in longitudinal and transverse directions along a plane of a capture surface of the sensor.

6. The papillary print sensor according to claim 1, wherein a distance between an upper surface of an outermost layer of the sensor on a side opposite the same semiconducting substrate, and the matrix photodetector, is less than or equal to a distribution pitch of photodetectors of the matrix photodetector.

7. The papillary print sensor according to claim 1, wherein the light emitting device is composed of several gallium nitride light emitting diodes (LEDs), distributed in a distribution array with N rows and M columns, in which N and M are integers greater than 3, or of several gallium nitride LEDs, each in the form of a strip, distributed in one column or two columns of strips parallel to each other.

8. The papillary print sensor according to claim 1, wherein the light emitting device is composed of several gallium nitride light emitting diodes (LEDs), distributed in a distribution array with N rows and M columns, in which N and M are integers greater than 3, or of several gallium nitride LEDs, each in the form of a strip, distributed in one column or two columns of strips parallel to each other.

9. The papillary print sensor according to claim 1, wherein the light emitting device is polychromatic, the at least one gallium nitride LED comprising an active LED stack covered by at least one photoluminescent conversion stack.

10. The papillary print sensor according to claim 1,
    wherein the light emitting device is composed of several gallium nitride light emitting diodes (LEDs),
    the sensor further comprising a pyroelectric material extending between the gallium nitride LEDs,
    the pyroelectric material also extending between at least one lower electrode on a side of the same semiconducting substrate, and at least one upper electrode on another side opposite the same semiconducting substrate, so as to form an array of pyroelectric conversion elements.

11. The papillary print sensor according to claim 1,
    wherein the light emitting device is composed of one single gallium nitride light emitting diode (LED) with a series of through openings therein,
    the sensor further comprising a pyroelectric material extending in the through openings of the gallium nitride LED,
    the pyroelectric material also extending between at least one lower electrode on a side of the same semiconducting substrate, and at least one upper electrode on another side opposite the same semiconducting substrate, so as to form an array of pyroelectric conversion elements.

12. The papillary print sensor according to claim 10,
    wherein the at least one gallium nitride LED includes several gallium nitride LEDs,
    wherein the matrix photodetector is composed of photodiodes formed in the same semiconducting substrate, and
    wherein the pyroelectric material completely fills spaces between the several gallium nitride LEDs.

13. The papillary print sensor according to claim 11,
wherein the light emitting device is composed of one single gallium nitride light emitting diode (LED) with a series of through openings therein,
wherein the matrix photodetector is composed of photodiodes formed in the same semiconducting substrate, and
wherein the pyroelectric material completely fills the through openings of the at least one gallium nitride LED.

14. The papillary print sensor according to claim 10, wherein each of the gallium nitride LEDs comprises at least one upper LED electrode on a side opposite the same semiconducting substrate, the at least one upper LED electrode and at least one upper electrode of the pyroelectric material together being formed in a single piece by a same transparent conducting layer that extends without any openings above the same semiconducting substrate.

15. The papillary print sensor according to claim 11, wherein the single gallium nitride LED comprises an upper LED electrode on a side opposite the same semiconducting substrate, the upper LED electrode and at least one upper electrode of the pyroelectric material together being formed in a single piece by a same transparent conducting layer that extends without any openings above the same semiconducting substrate.

16. The papillary print sensor according to claim 10,
wherein each of the pyroelectric conversion elements in the array is connected to a device configured to measure pyroelectric charges,
the sensor further comprising:
at least one heating element configured to heat the pyroelectric conversion elements, and
a synchronisation device, connected to the measurement device and to one of the at least one heating element associated with a same pyroelectric conversion element, and the synchronisation device being configured to measure pyroelectric charges generated by the same pyroelectric conversion element, at predetermined times after the at least one heating element is activated.

17. The papillary print sensor according to claim 16,
wherein each of the gallium nitride LEDs comprises at least one upper LED electrode on a side opposite the same semiconducting substrate, the at least one upper LED electrode and at least one upper electrode of the pyroelectric material together being formed in a single piece by a same transparent conducting layer that extends without any openings above the same semiconducting substrate, and
wherein the at least one heating element comprises a series of electrical resistances extending above an electrical insulation layer covering the transparent conducting layer.

18. The papillary print sensor according to claim 11,
wherein each of the pyroelectric conversion elements in the array is connected to a device configured to measure pyroelectric charges,
the sensor further comprising:
at least one heating element configured to heat the pyroelectric conversion elements, and
a synchronisation device, connected to the measurement device and to one of the at least one heating element associated with a same pyroelectric conversion element, and the synchronisation device being configured to measure pyroelectric charges generated by the same pyroelectric conversion element, at predetermined times after the at least one heating element is activated.

19. The papillary print sensor according to claim 18,
wherein the single gallium nitride LED comprises an upper LED electrode on a side opposite the same semiconducting substrate, the upper LED electrode and at least one upper electrode of the pyroelectric material together being formed in a single piece by a same transparent conducting layer that extends without any openings above the same semiconducting substrate, and
wherein the at least one heating element comprises a series of electrical resistances extending above an electrical insulation layer covering the transparent conducting layer.

20. A smart phone comprising image acquisition means and a flash, and further comprising a papillary print sensor according to claim 1, wherein the flash is composed of a plurality of gallium nitride light emitting diodes (LEDs) formed on the same semiconducting substrate of the papillary print sensor.

21. A method of fabricating a papillary print sensor according to claim 1, the light emitting device being composed of several gallium nitride light emitting diodes (LEDs), the method comprising:
a) adding an active LED stack onto a face of the same semiconducting substrate, comprising at least first and second doped semiconducting layers with opposite types of conductivity;
b) forming trenches in the active LED stack to delimit the several gallium nitride LEDs; and
c) forming the matrix photodetector in and/or above the same semiconducting substrate,
wherein step c) is implemented before or after steps a) and b).

22. A method of fabricating a papillary print sensor according to claim 1, the light emitting device being composed of one single gallium nitride light emitting diode (LED) with a series of through opening therein, the method comprising:
a) adding an active LED stack onto a face of the same semiconducting substrate, comprising at least first and second doped semiconducting layers with opposite types of conductivity;
b) forming trenches in the active LED stack to pierce openings passing through the single gallium nitride LED; and
c) forming the matrix photodetector in and/or above the same semiconducting substrate,
wherein step c) is implemented before or after steps a) and b).

23. The papillary print sensor according to claim 1, wherein the light emitting device is composed of one single gallium nitride light emitting diode (LED) with a series of through openings therein.

24. The papillary print sensor according to claim 1, wherein the light emitting device is composed of a plurality of gallium nitride light emitting diodes (LED).

* * * * *